(12) United States Patent
Gutierrez et al.

(10) Patent No.: US 6,526,113 B1
(45) Date of Patent: Feb. 25, 2003

(54) GM CELL BASED CONTROL LOOPS

(75) Inventors: German Gutierrez, Carlsbad, CA (US); Afshin Momtaz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/540,243

(22) Filed: Mar. 31, 2000

Related U.S. Application Data

(60) Provisional application No. 60/148,379, filed on Aug. 11, 1999, provisional application No. 60/148,417, filed on Aug. 11, 1999, and provisional application No. 60/148,418, filed on Aug. 11, 1999.

(51) Int. Cl.[7] .............................. H03D 3/24; H03L 7/085
(52) U.S. Cl. ...................... 375/376; 327/156; 327/157; 331/25; 331/32
(58) Field of Search ................................. 375/374, 376; 327/147, 148, 156, 158; 331/10, 12, 14, 17, 18, 25, 32, 36 R

(56) References Cited

U.S. PATENT DOCUMENTS

| | | | | |
|---|---|---|---|---|
| 5,384,502 A | * | 1/1995 | Volk | 327/157 |
| 5,406,631 A | * | 4/1995 | Takeda et al. | 381/4 |
| 5,479,126 A | * | 12/1995 | Pan et al. | 327/157 |
| 5,495,512 A | * | 2/1996 | Kovacs et al. | 375/376 |
| 5,564,089 A | * | 10/1996 | Barrett, Jr. | 455/196.1 |
| 5,570,398 A | * | 10/1996 | Smith | 375/376 |
| 5,572,163 A | * | 11/1996 | Kimura et al. | 327/553 |
| 5,757,216 A | * | 5/1998 | Murata | 327/156 |
| 5,864,249 A | * | 1/1999 | Shoji | 327/156 |
| 5,867,333 A | * | 2/1999 | Saiki et al. | 360/51 |
| 5,920,233 A | * | 7/1999 | Denny | 331/14 |
| 6,057,739 A | * | 5/2000 | Crowley et al. | 331/14 |
| 6,271,711 B1 | * | 8/2001 | Shenoy | 327/530 |

* cited by examiner

Primary Examiner—Young T. Tse
(74) Attorney, Agent, or Firm—Townsend and Townsend and Crew, LLP

(57) ABSTRACT

Various circuit techniques employ a transconductance (gm) cell in control loops to implement circuits such as phase locked loops and delay locked loops that are capable of operating at ultra high frequencies with improved precision and noise performance. The gm cell is designed to operate on an analog input signal with a very small swing and more gradual transition edges. These characteristics allow implementation of high frequency circuits and systems including, for example, transceivers for fiber optic channels, disk driver electronics and the like.

29 Claims, 13 Drawing Sheets

GM CELL BASED CONTROL LOOPS

CROSS-REFERENCES TO RELATED APPLICATIONS

This application claims the benefit of the following U.S. provisional patent applications:

Application Serial No. 60/148,379, entitled "Separating Pole and Zero for Fast Acquisition Phase Lock Loops," filed Aug. 11, 1999, by Afshin Momtaz;

Application Serial No. 60/148,417, entitled "GM Cell Based Phase Lock Loops for High Frequency Applications," filed Aug. 11, 1999, by Afshin Momtaz; and Application Serial No. 60/148,418, entitled "Fast Acquisition Phase Lock Loops Using a Current DAC," filed Aug. 11, 1999, by Afshin Momtaz.

BACKGROUND OF THE INVENTION

The present invention relates generally to electronic circuits, and more particularly to transconductance cell (or gm cell) based control loops such as phase locked loops, frequency locked loops, delay locked loops, combinations thereof (e.g., phase and frequency locked loops), and systems using the same.

As one type of control loop, a phase locked loop (PLL) is commonly used in many electronics applications to maintain a fixed phase relationship between an input (e.g., clock) signal and a reference signal. A phase locked loop designed for a digital application typically includes a phase and/or frequency detector, a charge pump, a loop filter, a VCO, and an (optional) divider. The phase detector determines the phase differences between an input signal (i.e., an input data stream or an input clock) and a reference signal derived from the VCO, and generates a detector output signal indicative of the detected phase differences. The charge pump receives the detector output signal and generates a set of phase error signals (e.g., UP and DOWN). The loop filter filters the phase error signals to generate a control signal that is then used to adjust the frequency of the VCO such that the frequencies of the two signals provided to the phase detector are locked.

FIG. 1 is a block diagram of a conventional phase locked loop 100. An input signal is provided to a phase detector 110 that also receives a reference signal from a divider 124. The input signal can be a clock signal, a data stream, or some other types of signal having phase and/or frequency information to which the phase locked loop can locked. The reference signal is typically a clock signal used to trigger the phase detector. Phase detector 110 generates an output signal PDOUT indicative of the timing differences (i.e., the phase differences) between the input signal and the reference signal. The PDOUT signal is provided to a charge pump 114 that generates an output signal CPOUT indicative of the detected phase error between the input and reference signals. In some designs, the CPOUT signal is logic high if the phase of the input signal is early (or late) relative to that of the reference signal, logic low if the phase of the input signal is late (or early) relative to that of the reference signal, and tri-stated for a period of time between clock edges.

The CPOUT signal is provided to a loop filter 120 that filters the signal with a particular transfer characteristic to generate a control signal. The control signal is then provided to, and used to control the frequency of, a voltage-controlled oscillator (VCO) 122. VCO 122 generates an output clock CLK_OUT having a frequency that is locked to that of the input signal (when the phase locked loop is locked). The output clock is provided to divider 124 that divides the frequency of the output clock by a factor of N to generate the reference signal. Divider 124 is optional and not used when the frequency of the output clock is the same as that of the input signal (i.e., N=1). The control signal adjusts the frequency of VCO 122 such that the frequencies of the two signals provided to phase detector 110 are locked.

The charge pump typically requires an input signal having rail-to-rail signal swing and sharp edges. Signals meeting these requirements can be readily provided by a phase detector at (relatively) low operating frequencies. However, at higher frequencies (e.g., 2.488 GHz for a SONET OC-48 transceiver), it is difficult to design a phase detector having rail-to-rail signal swing and sharp edges. To provide the required signal characteristics, the phase detector would typically need to be designed using a combination of large die area and large amounts of bias current. Besides the design challenge for such phase detector, the rail-to-rail signal swing and sharp edges generate large amounts of noise that can degrade the performance of the phase locked loop and other nearby circuits.

Accordingly, locked loops capable of high speed of operation and having improved performance are highly desirable.

SUMMARY OF THE INVENTION

The invention provides transconductance (or gm) cell based control loops that can be advantageously used in many applications, especially high speed communications systems. The gm cell (or gm amplifier) operates on signals having smaller swings (e.g., 400 mV peak-to-peak or smaller) and more gradual transition edges. These signal characteristics allow the preceding phase detector to be designed to operate at high frequencies and biased with less current. The gm cell based locked loops of the present invention can be efficiently designed and fabricated, and also have improved performance (e.g., reduced clock jitter) over conventional locked loops.

An embodiment of the invention provides a locked loop for use in a high frequency application such as an optical transceiver. The locked loop includes a detector, a transconductance (gm) amplifier, a loop filter, and an oscillator. The detector (which can be a phase detector or a frequency detector, or combination of both) receives an input signal and a reference signal and provides a detector output signal indicative of the difference between the input and reference signals. The difference can be phase or frequency, etc., depending on the application. The gm amplifier receives and converts the detector output signal to a current signal. The loop filter receives and filters the current signal with a particular transfer function to provide a control signal. The oscillator receives the control signal and provides an oscillator signal (e.g., a clock) having a property (e.g., frequency) that is adjusted by the control signal. The reference signal is adjusted by from the oscillator signal.

In one design, the gm amplifier includes a differential amplifier coupled to a current load circuit and a common mode feedback circuit. The differential amplifier receives the detector output signal and provides signal gain, the current load circuit provides the current load for the differential amplifier, and the common mode feedback circuit provides a bias control signal that adjusts the average current of the current load.

The locked loop typically includes a lowpass filter that receives and filters the detector output signal to remove high frequency components. The filtered signal is then provided to the gm amplifier. The lowpass filter can be implemented as a single-pole RC filter. In some designs, the locked loop further includes a divider that receives and divides the frequency of the oscillator signal by a factor of N to generate the reference signal. The input signal can be a serial data stream or a clock signal. For optical applications, the serial data stream can have a data rate of 2.488 GHz or higher.

The detector and gm amplifier can be implemented using CMOS circuits. For improved performance (e.g., improved linearity, higher immunity to noise, and so on), the elements of the locked loop (e.g., the detector, the gm amplifier, and others) can be implemented using differential circuits and designed to operate on differential signals. The detector, gm amplifier, and at least a portion of the loop filter and oscillator can be fabricated on one CMOS integrated circuit. The detector output signal can be designed to have a peak-to-peak signal swing of less than one volt (e.g., 400 mV peak-to-peak in one specific design).

Another embodiment of the invention provides a method for generating an oscillator signal that is locked to an input signal. In accordance with the method, the input signal and a reference signal derived from the oscillator signal are received and used to generate a detector output signal indicative of the timing differences between the input and reference signals. The detector output signal is converted to a current signal with a gm amplifier and filtered with a loop filter to generate a control signal. The frequency of an oscillator is then adjusted with the control signal such that the oscillator signal is locked to the input signal. The detector output signal is typically filtered with a lowpass filter to remove high frequency components. The input signal can be a serial data stream or a clock signal, and the detector output signal can have a peak-to-peak signal swing of less than one volt. Other features such as those described above can also be applied.

The foregoing, together with other aspects of this invention, will become more apparent when referring to the following specification, claims, and accompanying drawings.

DESCRIPTION OF THE SPECIFIC EMBODIMENTS

The present invention employs gm cells to implement high frequency control loops that exhibit improved accuracy and reduced noise. In accordance with an aspect of the invention, to provide a phase locked loop capable of operating at high frequencies and to reduce the amount of switching noise generated by the phase detector, a gm cell is employed in the phase locked loop in place of the charge pump. The gm cell (which is also referred to as a gm amplifier) is a transconductance amplifier that converts a voltage input signal into a current output signal. The gm cell can be designed to operate on an input signal having a (relatively) small signal swing and more gradual transition edges, and is thus more suitable for high speed applications. These signal characteristics allow the phase detector and gm cell to be designed to generate less switching noise, which in turn improves the performance of the phase locked loop and other nearby circuits. Various design techniques can be used to implement the phase detector and gm cell to further improve the performance of the phase locked loop, and some of these techniques are described below. It is to be understood that phase locked loop is used herein for illustrative purposes only, and that the technique of the present invention can be applied to other types of control loops such a frequency and delay locked loops and the like.

Figure 1:
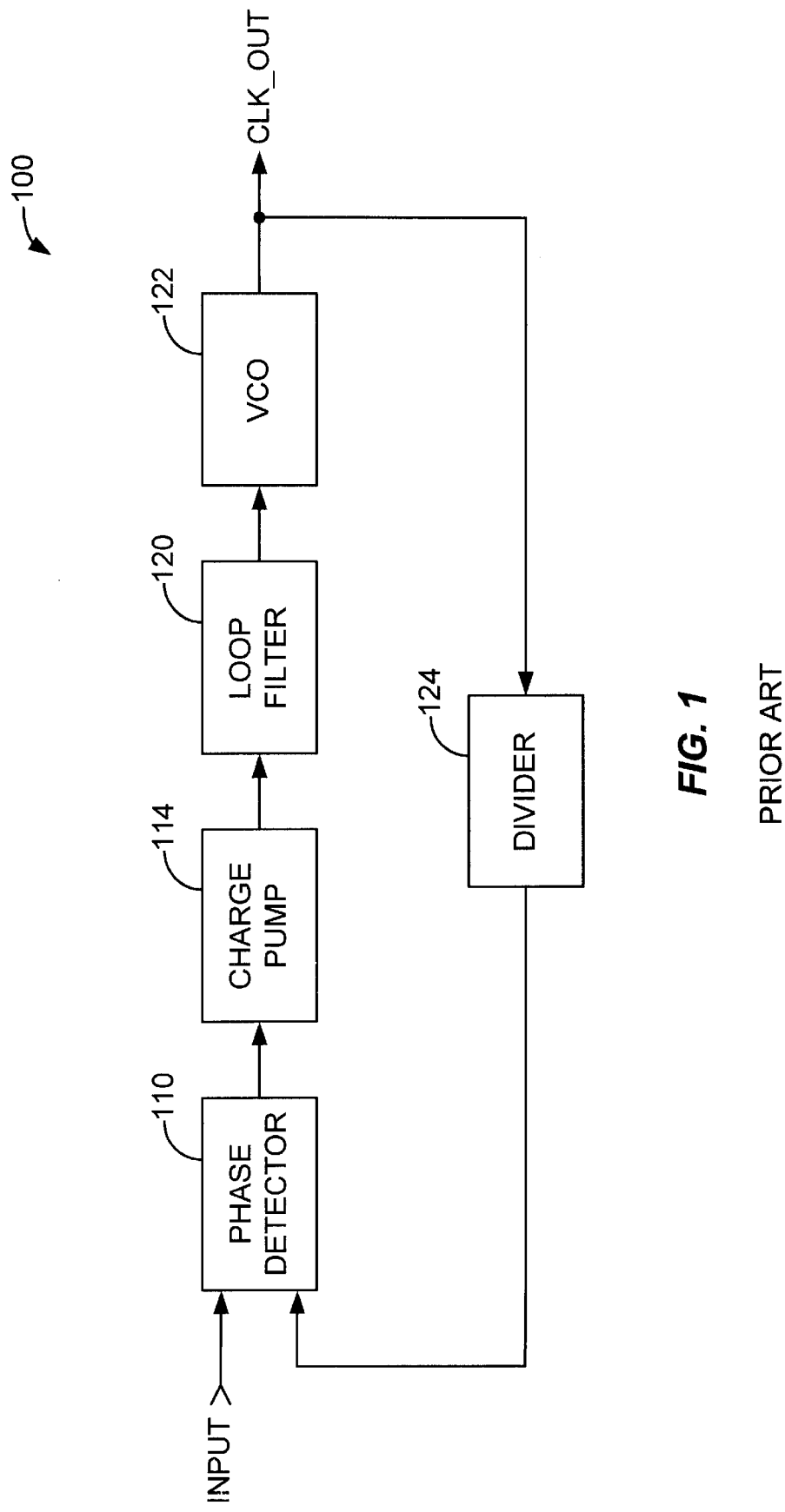
FIG. 1 is a block diagram of a conventional phase locked loop.
Figure 2:
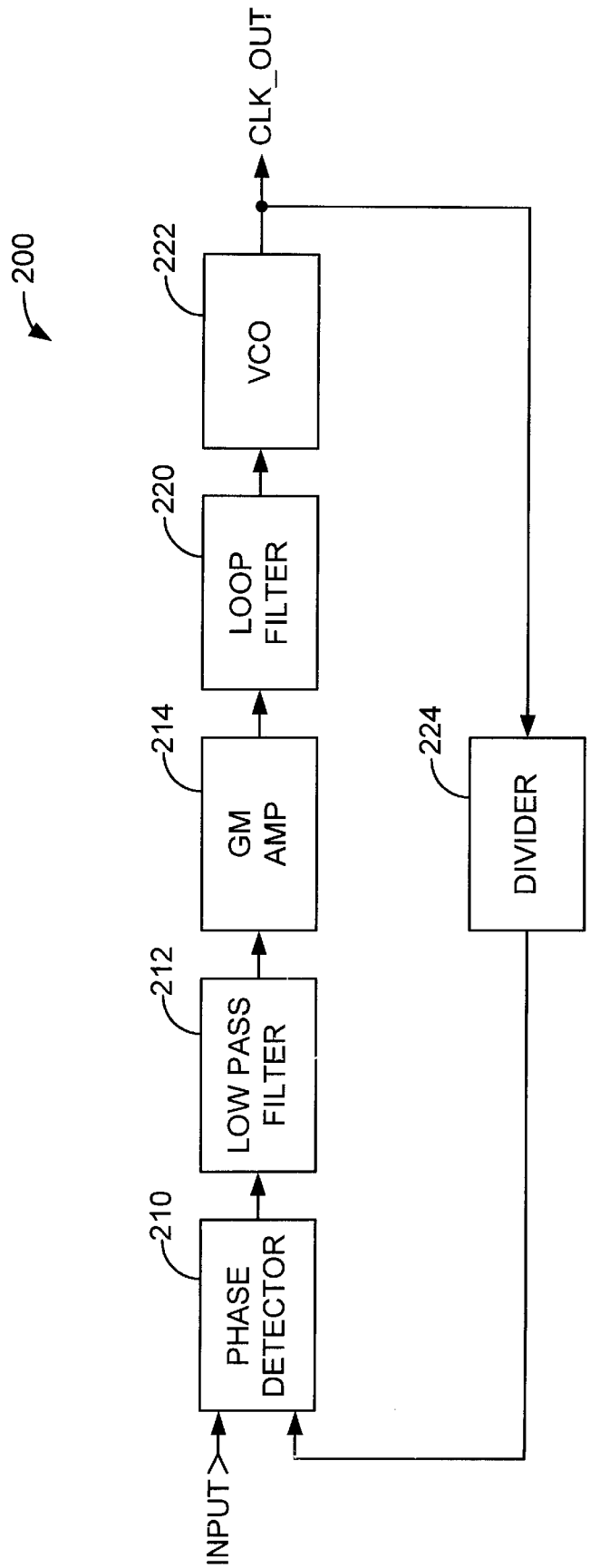
FIG. 2 is a block diagram of an embodiment of a gm cell based phase locked loop of the invention.

FIG. 2 is a block diagram of an embodiment of a gm cell based phase locked loop 200 of the invention. A phase detector 210 receives an input signal and a reference clock from a divider 224 and generates an output signal PDOUT indicative of the timing differences between the input and reference signals. In the embodiment shown in FIG. 2, the PDOUT signal is provided to a lowpass filter 212 that filters the signal to remove high frequency components. The lowpass filtered signal is then provided to a gm amplifier 214 that generates a current output signal GM_OUT indicative of the detected phase error between the input and reference signals. The GM_OUT signal is provided to a loop filter 220 that filters the signal with a particular transfer characteristic to generate a control signal.

The control signal is then provided to, and used to control the frequency of, a voltage-controlled oscillator (VCO) 222. VCO 222 generates an output clock CLK_OUT having a frequency that is locked to that of the input signal (when the phase locked loop is locked). The output clock is provided back to divider 224 that divides the frequency of the output clock by a factor of N to generate the reference clock. Again, divider 224 is optional and not needed when the frequencies of the input signal and output clock are the same (i.e., when N=1). The control signal adjusts the frequency of VCO 222 such that the frequency of the reference signal is locked to that of the input signal. The elements of phase lock loop 200 are described in further detail below.

Figure 3:
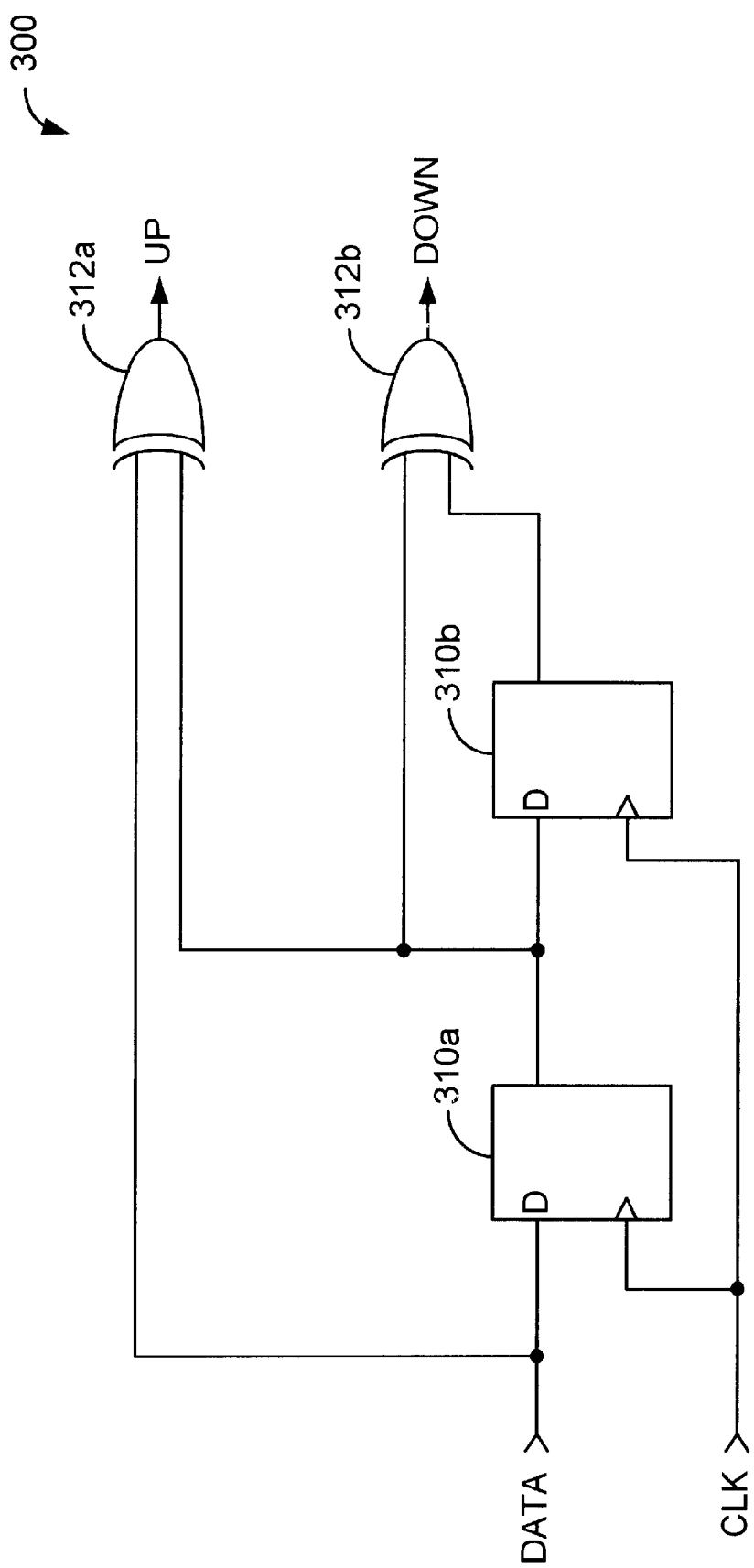
FIG. 3 is a block diagram of an embodiment of a phase detector.

FIG. 3 is a block diagram of an exemplary embodiment of a phase detector 300 that can be used for phase detector 210 in FIG. 2. As noted above, the input signal can be a clock signal, a serial data stream, or some other type of signal having phase and/or frequency information to which the phase locked loop can locked. Also, the reference signal is typically a reference clock used to trigger phase detector 300. In the embodiment shown in FIG. 3, phase detector 300 includes a pair of latches 310a and 310b coupled in series. The input data DATA is latched by latch 310a with the reference clock CLK and further latched by latch 310b with the reference clock. An exclusive-OR gate 312a receives and perform an exclusive-OR function on the input data and the data from latch 310a to generate the output signal UP. Similarly, an exclusive-OR gate 312b receives an performs an exclusive-OR function on the data from latches 310a and 310b to generate the output signal DOWN.

In the phase detector design shown in FIG. 3, the UP signal is high when the phase of the input data is early relative to the phase of the reference clock, and the DOWN signal is high when the phase of the input data is late relative to the phase of the reference clock. Other phase detector implementations such as Bang-Bang detectors can be employed and are within the scope of the present invention. If the input signal is a clock signal, a phase-frequency detector can be designed in a manner known in the art using a pair of flip-flops and some logic gates.

Figure 4:
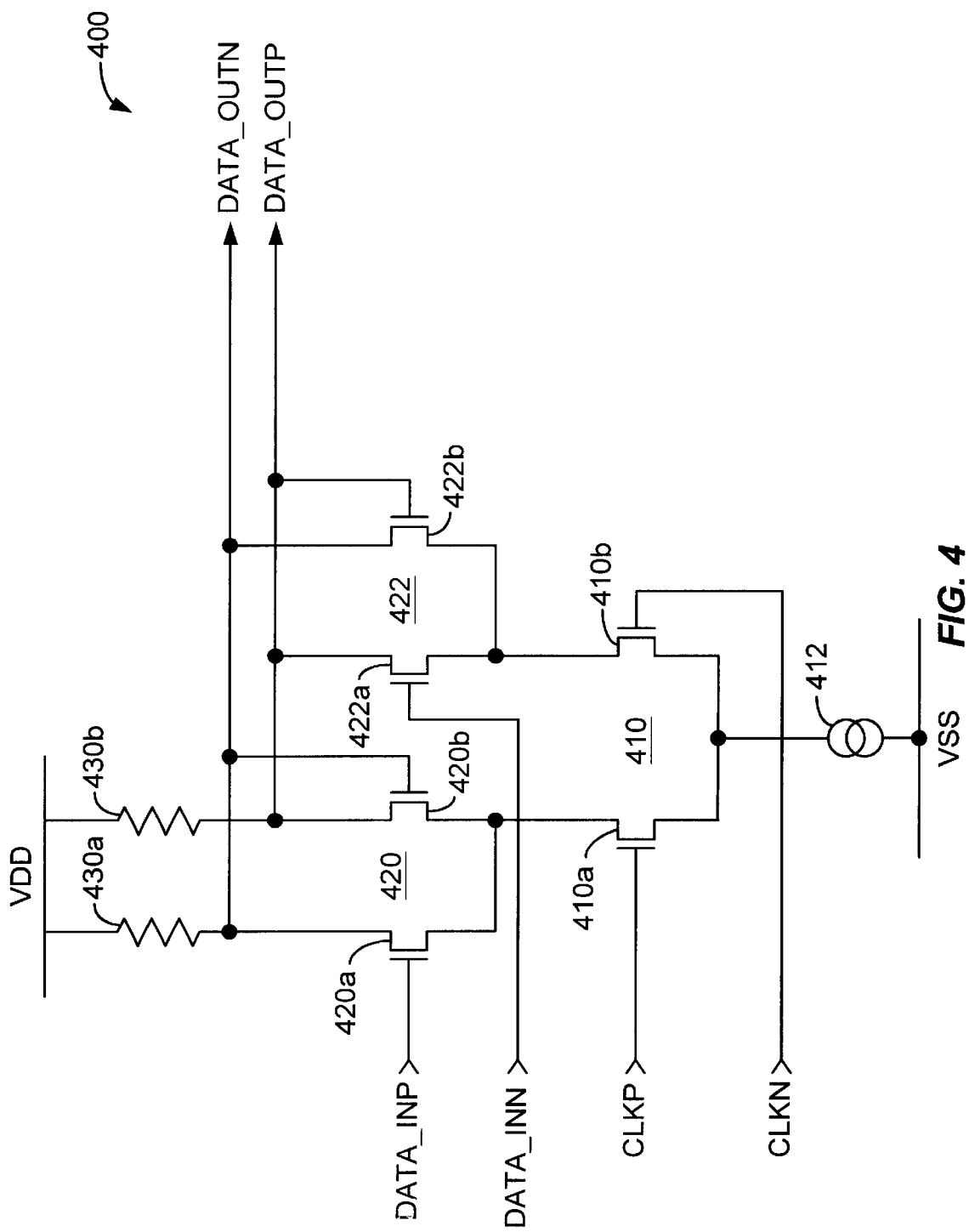
FIG. 4 is a schematic diagram of a specific implementation of a latch using CMOS technology.

FIG. 4 is a schematic diagram of a specific implementation of a latch 400 using CMOS circuitry. Latch 400 can be used to implement flip flops 310a and 310b in FIG. 3. For improved performance (e.g., higher speed, improved linearity, reduced noise, and so on), latch 400 uses current steering techniques employing differential signals and differential circuits. The differential clock signals CLKP and CLKN are provided to the inputs of a differential amplifier 410 comprised of transistors 410a and 410b. The sources of transistors 410a and 410b couple together and to one end of a current source 412. The other end of current source 412 couples to a supply source VSS, which is typically circuit ground.

The positive input data DATA_INP is provided to one input of a differential amplifier 420 comprised of transistors 420a and 420b, and the inverted input data DATA_INN is provided to one input of a differential amplifier 422 comprised of transistors 422a and 422b. The sources of transistors 420a and 420b couple together and to the drain of transistor 410a, and the sources of transistors 422a and 422b couple together and to the drain of transistor 410b. The drains of transistors 420a and 422b, the base of transistor 420b, and one end of a resistor 430a couple together and form the inverted latch output DATA_OUTN. Similar the drains of transistors 420b and 422a, the base of transistor 422b, and one end a resistor 430b couple together and form the latch output DATA_OUTP. The other ends of resistors 430a and 430b couple to a second supply source VDD, which is typically the positive supply (e.g., 5.0V, 3.3V, 2.4V, or some other voltages). Because of a signal inversion through transistors 420a and 422a, the differential output signals are effectively swapped with respect to the differential input signals.

Latch 400 is designed for high speed, low power, and improved noise performance. Differential amplifiers 420 and 422 receive and buffer the input data, and are controlled by differential amplifier 410, which is in turn controlled by the differential clock signals. The stacked configuration, with differential amplifiers 420 and 422 coupled on top of differential amplifier 410, reduces power consumption. This particular circuit implementation for latch 400 using current steering is referred to as current-controlled CMOS (or C³MOS) logic, which is the subject of commonly-assigned patent application Ser. No. 09/484,856, entitled "Current-Controlled CMOS Logic Family," by A. Hairapetian, hereby incorporated by reference. While C³MOS is a preferred implementation due to its improved performance, conventional CMOS logic techniques can also be used. The same applies to exclusive OR gates 312a and 312b, which can be implemented either by C³MOS logic as described in greater detail in the above-referenced application, or by conventional CMOS logic.

Figure 5:
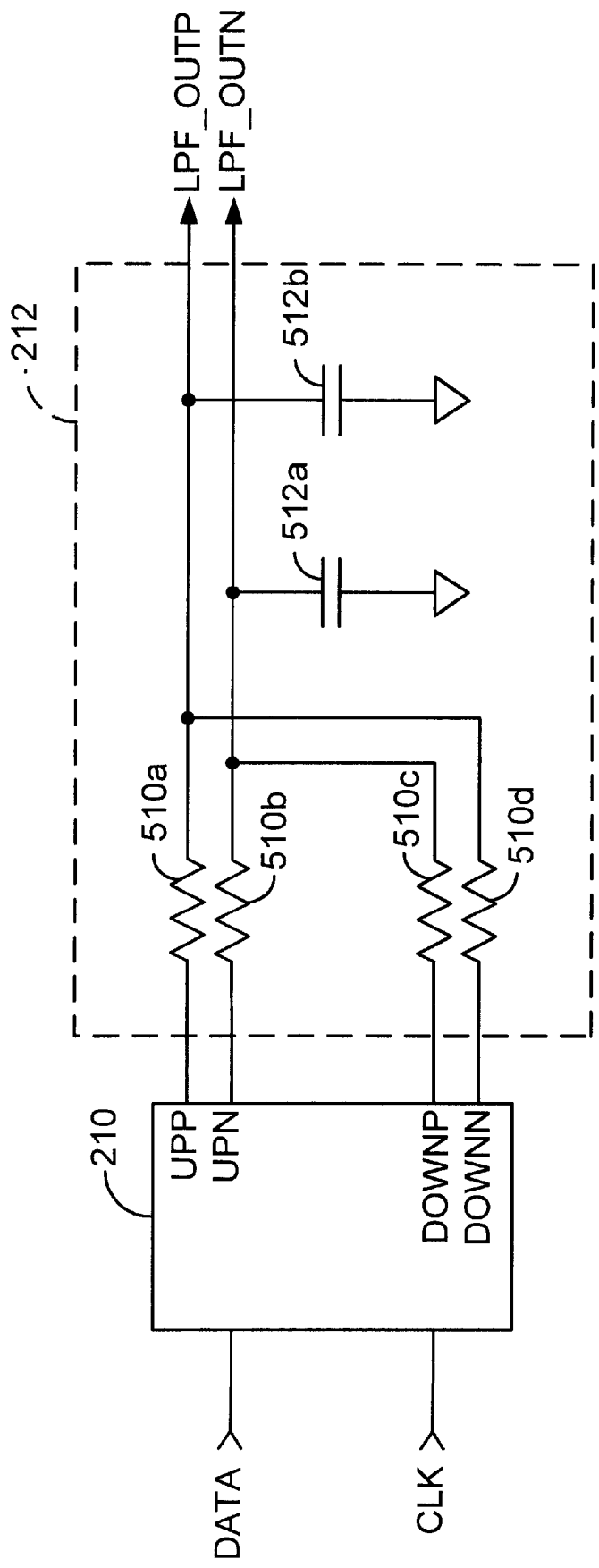
FIG. 5 is a diagram of an embodiment of a lowpass filter used to filter the signals from the phase detector.

FIG. 5 is a diagram of an embodiment of lowpass filter 212. In this embodiment, lowpass filter 212 is designed as a differential filter that combines the differential signals UPP and UPN and the differential signals DOWNP and DOWNN to generate the differential output signals LPF_OUTP and LPF_OUTN. Within lowpass filter 212, the signals UPP, UPN, DOWNP, and DOWNN are provided to one end of resistors 510a through 510d, respectively. The other ends of resistors 510a and 510d and one end of a capacitor 512b couple together and form the output signal LPF_OUTP. Similarly, the other ends of resistors 510b and 510c and one end of a capacitor 512a couple together and form the inverted output signal LPF_OUTN. Resistors 510 and capacitors 512 form a single pole RC filter having a bandwidth of BW=1/RC.

Lowpass filter 212 filters the signals from phase detector 210 such that high frequency components are removed, thus reducing the amount of switching noise passed to subsequent circuitry. The reduced bandwidth of the filtered signal also relaxes the design requirements of the subsequent gm amplifier 214, thereby allowing the gm amplifier to be designed with less current and smaller die area. Some or all elements of lowpass filter 212 can be fabricated on the same integrated circuit as phase detector 210. For example, resistors 510 can be fabricated on the integrated circuit and capacitors 512 can be either external components or fabricated on the same integrated circuit. In some phase locked loop designs, lowpass filter 212 can be eliminated to reduce component count.

Figure 6A:
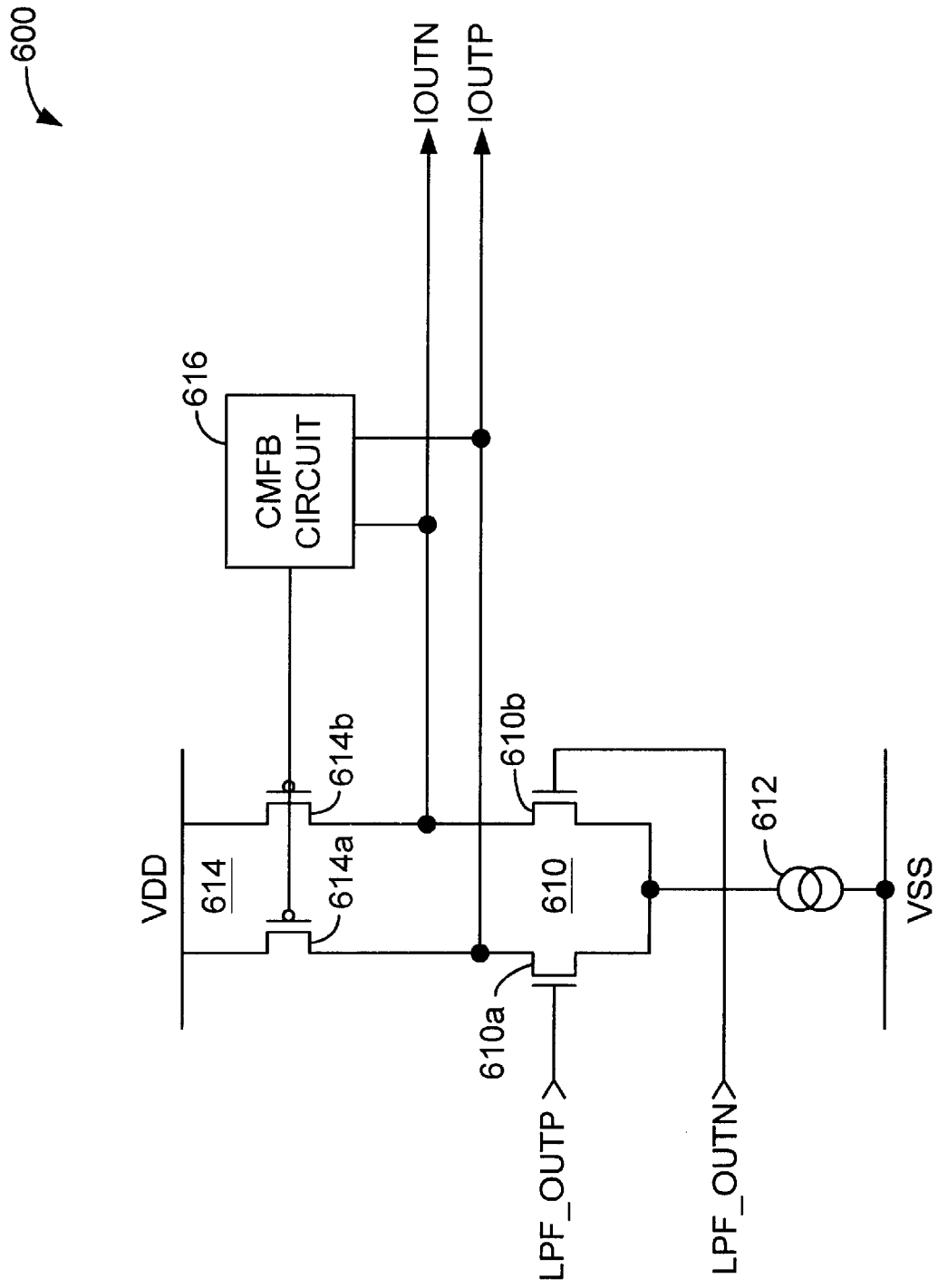
FIGS. 6A and 6B are schematic diagrams of a specific implementation of a differential gm amplifier and the common-mode feedback circuit used in the amplifier, respectively.

FIG. 6A is a schematic diagram of a specific implementation of a gm amplifier 600 using differential CMOS circuitry. Gm amplifier 600, which can be used to implement gm amplifier 214 in FIG. 2, includes a differential amplifier 610 coupled to a current source 612, a current load circuit 614, and a common mode feedback (CMFB) circuit 616. As shown in FIG. 6A, the differential voltage input signals LPF_OUTP and LPF_OUTN from the preceding lowpass filter are provided to the gates of transistors 610a and 610b, respectively. The sources of transistors 610a and 610b couple together and to one end of current source 612. The other end of current source 612 couples to a supply source VSS.

Figure 6B:
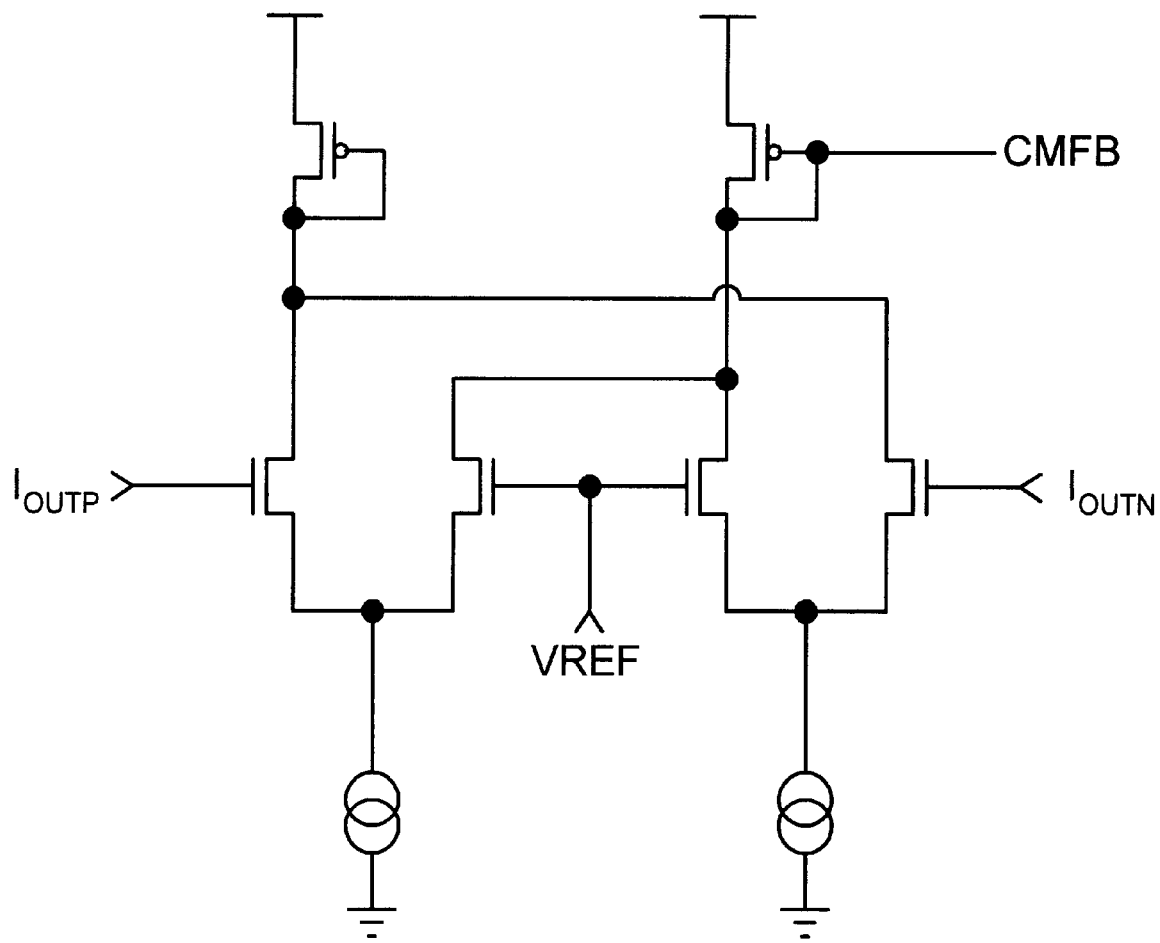

The drains of transistors 610a and 610b couple to respective current sources 614a and 614b of current load circuit 614 and form the current output signals IOUTP and IOUTN, respectively. Each of current sources 614a and 614b is implemented with a transistor having its gate coupled to CMFB circuit 616, which provides a bias control voltage that sets the currents of current sources 614a and 614b such that the average currents on IOUTN and IOUTP are at the proper values. CMFB circuit 616 receives the output signals IOUTP and IOUTN, determines the average current, and sets the bias control voltage accordingly. An exemplary circuit implementation for CMFB circuit 616 us provided in FIG. 6B.

Current load circuit 614 effectively transforms a differential voltage amplifier into a differential gm amplifier. Each of current sources 614a and 614b provides a particular average amount of current. As the input voltage (e.g., LPF_OUTP) increases, the transistor in the differential amplifier turns on harder and conducts more current, thereby reducing the amount of current that is provided from the corresponding current source to the output. Alternatively, as the input voltage decreases, the transistor turns on less hard and draws less current, thereby causing more current from the corresponding current source to be provided to the output. The differential output signals are swapped with respect to the differential input signals because of the signal inversion through the input differential amplifier.

Figure 6C:
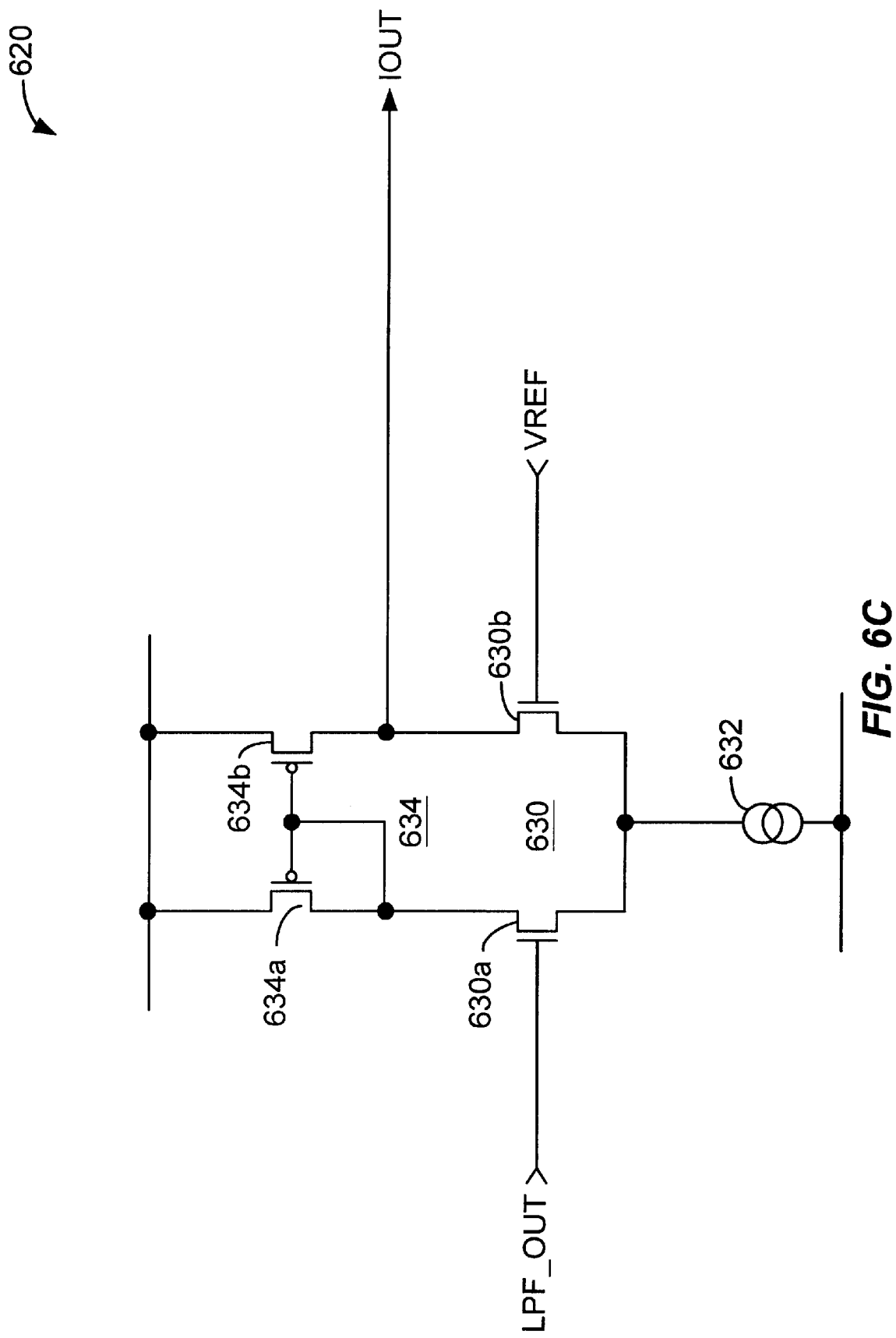
FIG. 6C shows an exemplary circuit implementation for an alternate embodiment of a gm amplifier using single-ended architecture.

Gm cell based locked loops can also be implemented using a single-ended gm amplifier. FIG. 6C is a schematic diagram of a specific implementation of a gm amplifier 620 using single-ended CMOS circuitry. Gm amplifier 620 includes an input differential amplifier 630 coupled to a current source 632 and a current load circuit 634. Differential amplifier 630 comprises transistors 630a and 630b, with the gate of transistor 630a receiving the voltage input signal LPF_OUT and the gate of transistor 630b receiving a reference voltage VREF. The drains of transistors 630a and 630b couple to the drains of transistors 634a and 634b, respectively. The gates of transistors 634a and 634b couple together and to the drain of transistor 634a, thereby effectively biasing each of transistors 634a and 634b to half the current of current source 632. The drain of transistor 630b forms the current output signal IOUT.

Figure 7:
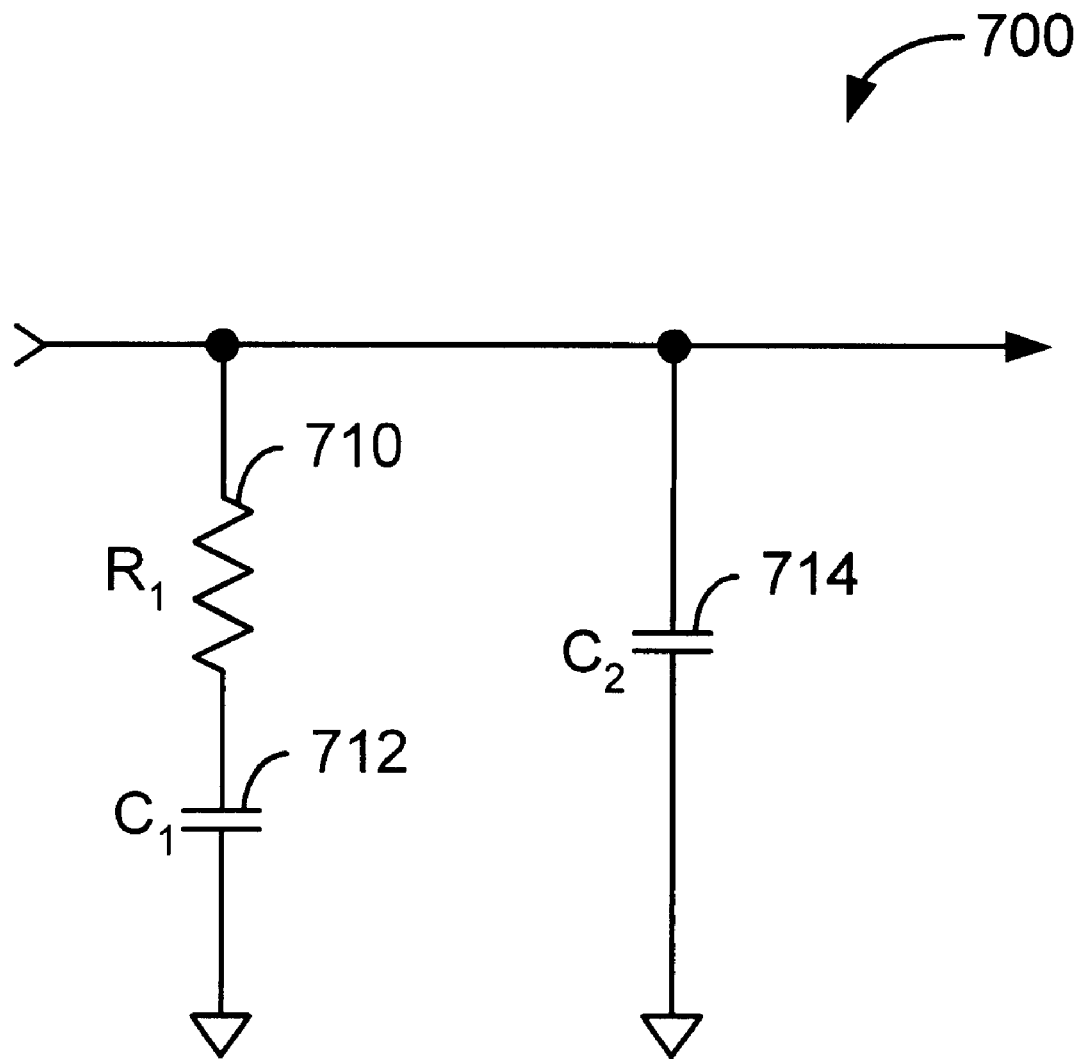
FIG. 7 is a schematic diagram of a specific implementation of a loop filter.

FIG. 7 is a schematic diagram of a specific implementation of a loop filter 700 that can be used to implement loop filter 220 in FIG. 2. In this implementation, loop filter 700 includes a resistor 710 coupled in series with a capacitor 712, the combination of which couple in parallel with a capacitor 714. The frequency response of loop filter 700 has a pole at DC and a zero at $$f_z = \frac{C_1 + C_2}{R_1 C_1 C_2}.$$

Loop filter 700 determines the closed loop response of the phase locked loop. Different loop filters can be designed and are within the scope of the present invention.

VCO 222 in FIG. 2 can be designed in numerous ways. The particular circuit topology and component values used for VCO 222 are dependent on the requirements of the phase locked loop (e.g., the center frequency of the VCO, the desired phase noise characteristic, the required frequency tuning range, the available operating voltages, and so on). In a specific implementation, VCO 222 is implemented using delay cells and fabricated on the same CMOS integrated circuit with other elements of the phase locked loop. In a specific exemplary implementation, VCO 222 is designed to operate at 2.488 GHz (the data rate for SONET OC-48). It is to be understood that the technique of the present invention can be employed in circuits operating at any frequency, lower or higher than the exemplary 2.488 GHz, including for example optical networks based on OC-192, or a variety of other electronic systems. Furthermore, other types of VCOs such as those implemented using LC tuned oscillators can also be employed herein and fall within the scope of the invention.

Similarly, divider 224 in FIG. 2 can also be designed using various circuits. For example, divider 224 can be implemented with a counter, a set of registers or latches, and other circuits.

For low cost and ease of implementation, many of the elements of phase locked loop 200 are fabricated on a single integrated circuit. For example, phase detector 210, gm amplifier 214, and divider 224 can be fabricated on a single CMOS or bipolar integrated circuit.

The gm cell based locked loops of the present invention provide numerous advantages over conventional locked loops that employ charge pumps. By using a gm cell in place of a conventional charge pump, the phase detector can be designed to operate on signals having smaller signal swing (e.g., 400 mV peak-to-peak or much less) and more gradual transition edges. These signal characteristics can be provided by a phase detector implemented with analog-type circuitry (e.g., differential amplifiers) that can be operated at high frequency (e.g., 2.488 GHz, 9.952 GHz, or higher). In contrast, in conventional phase locked loop designs, the charge pump requires and operates on signals having large peak-to-peak signal swing and sharp transition edges. It is difficult to design a phase detector capable of providing signals having such characteristics at high frequencies.

The gm cell based locked loops, by operating on signals having smaller signal swing and relaxed transition edges, allow for fabrication of high-speed phase detectors in conventional CMOS technology, which is highly desirable for digital circuits. Circuits operating at comparable speeds have been traditionally fabricated using bipolar, ECL, GaAs, or some other high-speed processes that are more expensive and consume more power. CMOS process technology is relatively low cost and power efficient. It also allows for integration of other circuits to provide additional functionality, as described below.

The gm cell based locked loops also provide other benefits. Since the phase detector can be designed to operate on signals having smaller signal swing and more gradual transition edges, the amount of switching noise generated by the phase detector is reduced. Moreover, by filtering the phase detector output with a lowpass filter to remove unnecessary high frequency components, the design of the gm amplifier can be relaxed. The gm amplifier can be designed using smaller die area and biased with less current. In contrast, the charge pump in the conventional phase locked loop requires large swing, fast-switching signals from the phase detector, which typically translates to more switching noise and degraded phase locked loop performance.

As discussed above, the gm cell based implementation of a control loop according to the present invention is not limited to phase locked loops and can be applied to other types of control loops such as delay locked loops and frequency locked loops. These types of control loops find a wide variety of applications including data transmissions, communications systems, and others. Although the gm cell based phase locked loop is advantageously used in high frequency applications, it can also be used for low frequency applications. It is to be understood that the technique of the present invention can be employed in a variety of different applications including fiber optic networks, disk drive electronics, ATE or radio receivers and the like. In one embodiment described below, the present invention provides a gm cell based phase locked loop in a transceiver used along fiber optic channels.

Figure 8:
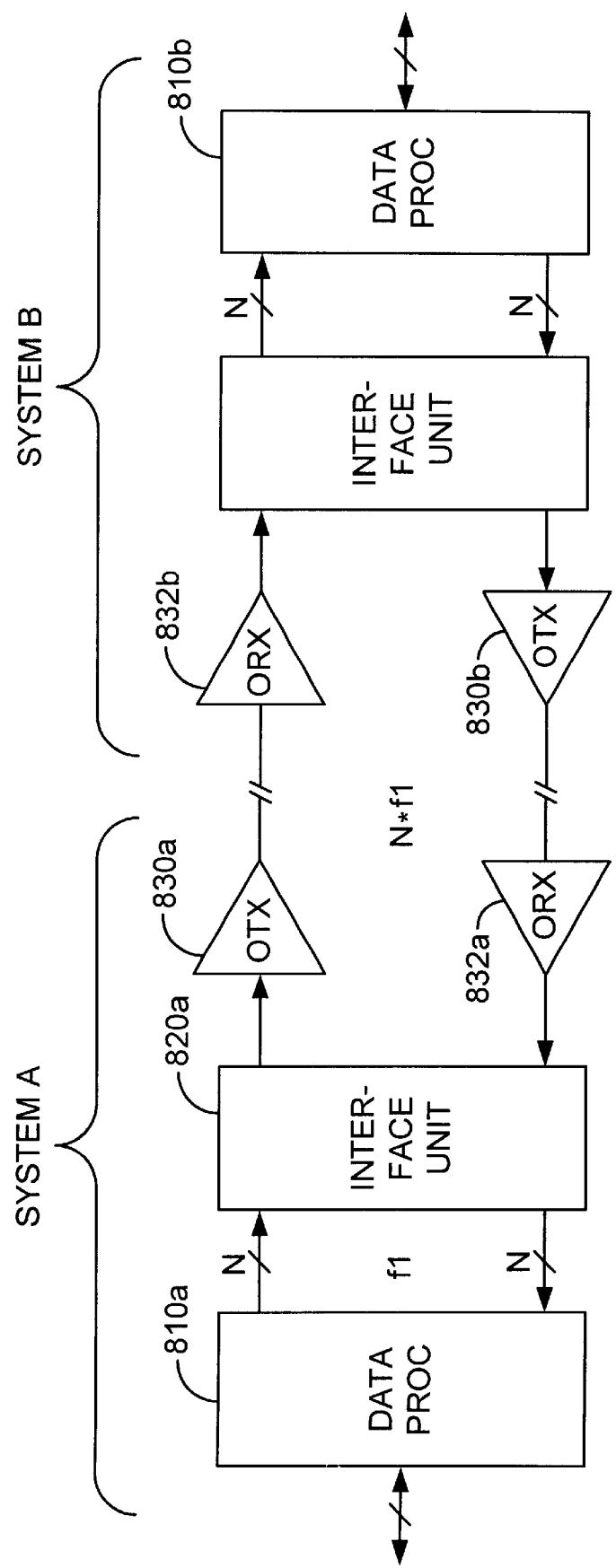
FIG. 8 is a block diagram of an optical communications network that employs the gm cell based locked loop of the invention.

FIG. 8 is a block diagram of an optical communications network that employs the gm cell based locked loop according to the present invention. The network in FIG. 8 includes system A in communication with system B. Each system includes a data processor 810 coupled to an interface unit 820 that further coupled to an optical transmitter (OTX) 830 and an optical receiver (ORX) 832. Each data processor 810 exchanges data with an external source, provides outgoing data in parallel format to interface unit 820, and receives incoming data in parallel format from interface unit 820. Each interface unit 820 receives parallel data from data processor 810, converts the data into serial format, and provides a serial data stream to optical transmitter 830. Each interface unit 820 further receives a serial data stream from optical receiver 832, converts the serial data into parallel format, and provides the parallel data to data processor 810. The parallel data has a data rate of f1 (e.g., 155 MHz for OC-48) and the serial data has a data rate of N•f1 (e.g., 2.488 GHz for OC-48, where N=16). For simplicity, system B is shown as a mirror image of system A. However, data processors 810a and 810b, interface unit 820a and 820b, optical transmitters 830a and 830b, and optical receivers 832a and 832b can be different designs.

Figure 9A:
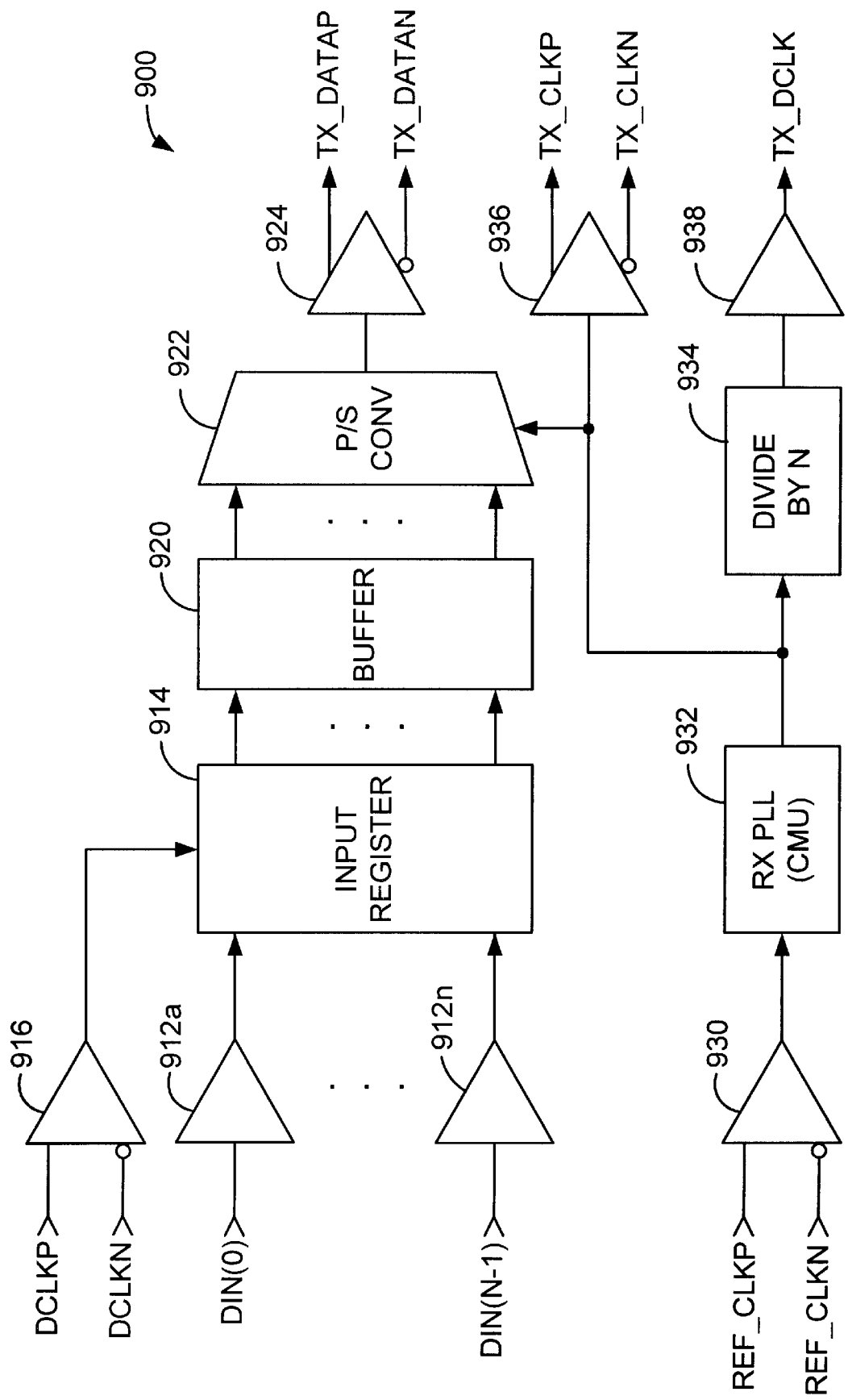
FIGS. 9A and 9B are block diagrams of an embodiment of a transmitter section and a receiver section, respectively, of an interface unit used in the optical communications network.

FIG. 9A is a block diagram of an embodiment of a transmitter section 900 of interface unit 820. The parallel input data DIN[0:N−1]is buffered by a set of buffers 912a through 912n, latched by an input register 914, buffered by a buffer 920, and provided to a parallel-to-serial converter (P/S CONV) 922. Buffer 920 can be implemented as a first-in-first-out (FIFO) buffer or some other type of buffer. Parallel-to-serial converter 922 serializes the parallel data with a transmit clock from a transmit phase locked loop (TX PLL) 932. A buffer 924 buffers the serial data and provides the transmit data TX_DATA to an optical transmitter (not shown in FIG. 9A).

A data clock DCLK is buffered by a buffer 916 and used by input register 914 to latch the input data. A reference clock REF_CLK, which can be at the same or different frequency as the data clock DCLK, is buffered by a buffer 930 and used by phase locked loop 932 to generate the transmit clock, which is provided to parallel-to-serial converter 922, a buffer 936, and a divider 934. Parallel-to-serial converter 922 uses the transmit clock to perform the parallel-to-serial conversion. The transmit clock is buffered by buffer 936 and provided as the output transmit clock TX_CLK. The transmit clock is also divided by N (e.g., 16) by divider 934, buffered by a buffer 938, and provided as the transmit data clock TX_DCLK. Transmit phase locked loop 932 is also referred to as a clock multiplexing unit (CMU) and can be implemented using the gm cell based locked loop described above.

In some designs, some of the input and output signals are not needed and the corresponding circuits can be eliminated. For example, the reference clock REF_CLK may be used to trigger input register 914, in which case buffer 916 can be eliminated. Similarly, the output transmit clock TX_CLK and the output transmit data clock TX_DCLK may not be needed, in which case divider 934 and buffers 936 and 938 can be eliminated.

Figure 9B:
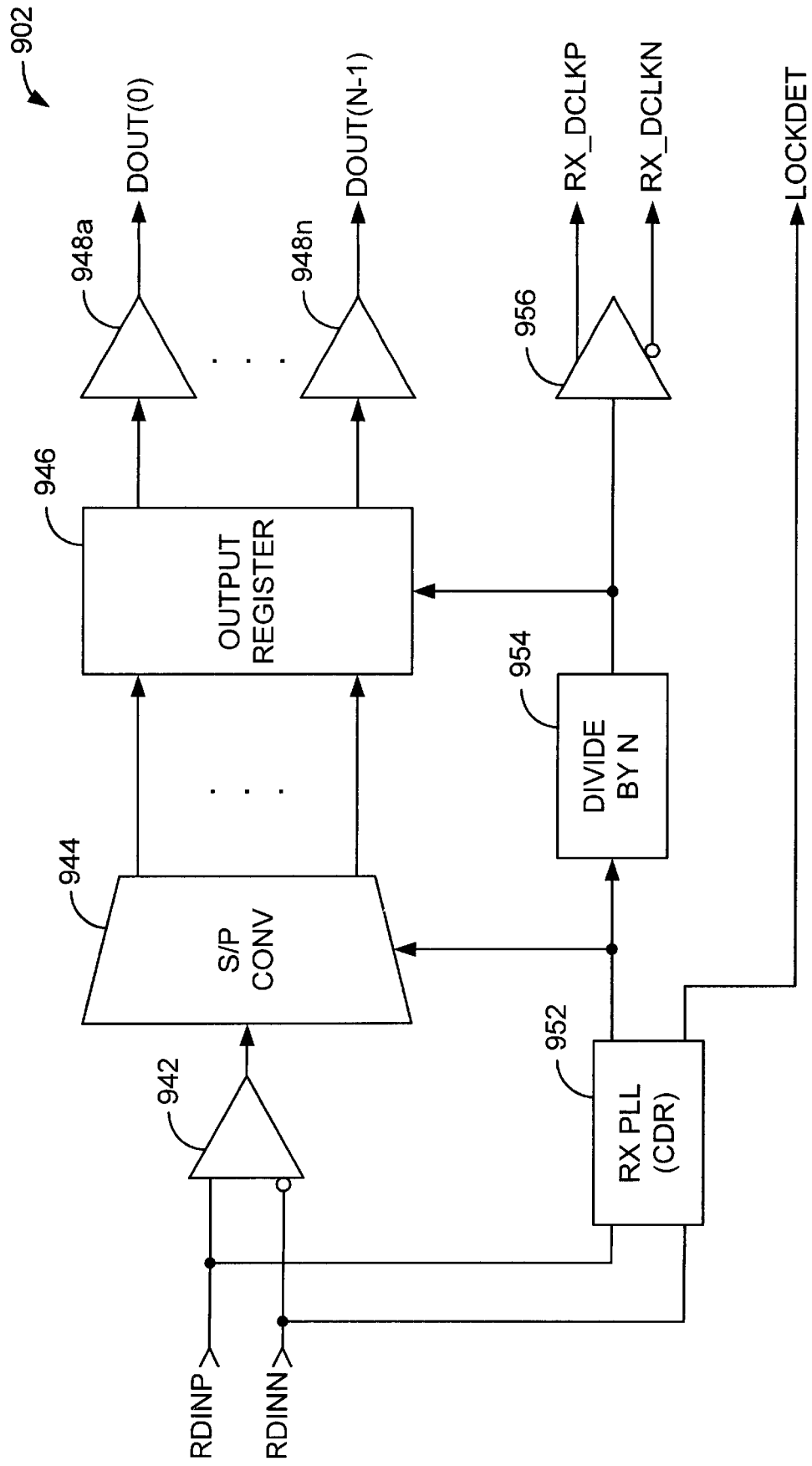

FIG. 9B is a block diagram of an embodiment of a receiver section 902 of interface unit 820. The serial input data RDIN is buffered by a buffer 942 and provided to a serial-to-parallel converter (S/P CONV) 944 that converts the serial data stream into parallel data. The parallel data is latched by an output register 946, buffered by a set of buffers 948a through 948n, and provided as the output data DOUT [0:N−1].

A receive phase locked loop RX_PLL 946 also receives the serial input data and generates a receive clock that is provided to serial-to-parallel converter 944 and a divider 954. Serial-to-parallel converter 944 uses the receive clock to perform the serial to parallel conversion. The serial clock is divided by N by divider 954, buffered by a buffer 956, and provided as the receive data clock RX_DCLK. The divided clock is also provided to register 946 and used to latch the parallel data. Receive phase locked loop 946 may also be designed to provide a signal LOCKDET indicative of whether the phase locked loop is locked or unlocked. Receive phase locked loop 946 is also referred to as a data and clock recovery unit (CDR) and can also be implemented using the gm cell based locked loop described above.

Figure 10:
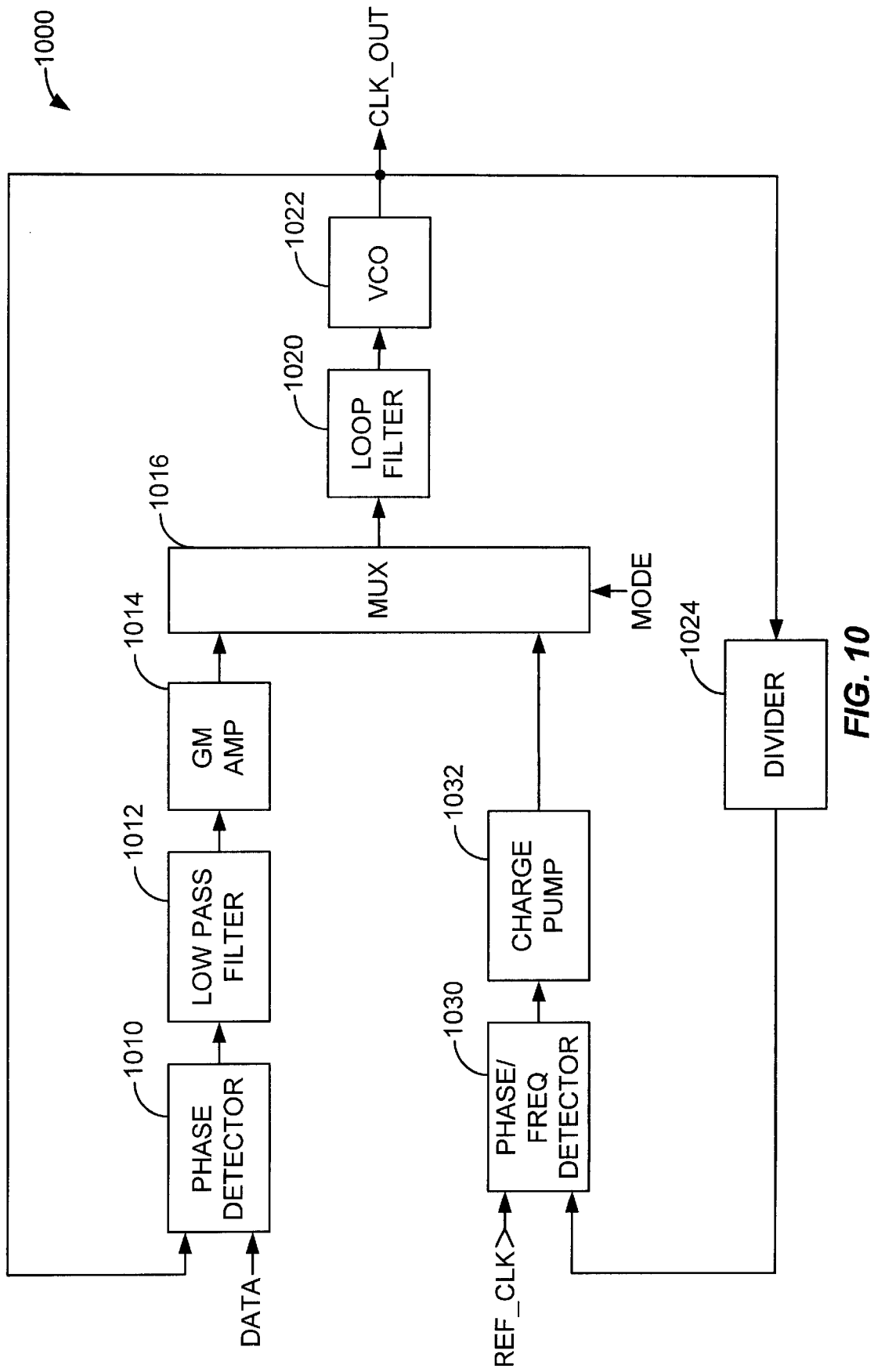
FIG. 10 is a block diagram of an embodiment of a phase locked loop that includes to a section for locking a VCO to a reference clock and another section for locking the VCO to an input data stream.

FIG. 10 is a block diagram of an embodiment of a phase locked loop 1000 that includes to a section for locking a VCO to a reference clock REF_CLK and another section for locking the VCO to the input data stream. All or a portion of phase locked loop 1000 can be implemented within transmit phase locked loop 932 in FIG. 9A and receive phase locked loop 952 in FIG. 9B. For example, transmit phase locked loop 932 can be implemented with just the section that locks the VCO to the reference clock, and receive phase locked loop 952 can be implemented with both sections to allow the VCO to be locked to the reference clock and the input data stream.

Within the top section of phase locked loop 1000, a phase detector 1010 receives the input data stream and the output clock CLK_OUT from a VCO 1022, compares the received data and clock to determine the timing differences, and generates an output indicative of the detected timing differences. The phase detector output is filtered by a lowpass filter 1012 and provided to a gm amplifier 1014. Gm amplifier 1014 converts the voltage input signal into a current output signal, with the output and input signals related by a transconductance gain. The current output signal is provided via a multiplexer (MUX) 1016 to a loop filter 1020, which filters the signal with a particular transfer function to generate a control signal. The control signal is used to adjust the frequency of VCO 1022.

Within the bottom section of phase locked loop 1000, a phase and frequency detector 1030 receives the reference clock and a divided clock from a divider 1024, compares the received clocks to determine the timing differences, and generates an output indicative of the detected timing differences. The output from phase and frequency detector 1030 is provided to a charge pump 1032 that generates a phase error signal, which is then provided via multiplexer 1016 to loop filter 1020. Loop filter 1020 filters the signal with another particular transfer function to generate the control signal. The transfer function for the signal from gm amplifier 1014 may be the same or different from the transfer function for the signal from charge pump 1032.

Phase detector 1010, lowpass filter 1012, and gm amplifier 1014 forms the section that allows phase locked loop 1000 to locked VCO 1022 to the input data stream. Phase detector 1030 and charge pump 1032 forms the section that allows phase locked loop 1000 to locked VCO 1022 to the reference clock. Phase detector 1010, lowpass filter 1012, gm amplifier 1014, loop filter 1020, and VCO 1022 in FIG. 10 can be implemented similar to phase detector 210, lowpass filter 212, gm amplifier 214, loop filter 220, and VCO 222 in FIG. 2.

In phase locked loop 1000, only one section is operational at any given moment, and this is determined by a mode control signal MODE that selects the signal at one of the inputs of multiplexer 1016 to provide to loop filter 1020. Typically, VCO 1022 is locked to the reference clock when no input data stream is present and during the loop acquisition process. The reference clock is typically an accurate clock (e.g., generated from a crystal based oscillator) and used to adjust the frequency of VCO 1022 to be close to that of the input data stream. VCO 1022 is then locked to the input data stream.

Transmitter section 900 and receiver section 902 can be implemented in various manners. In an embodiment, these sections are advantageously designed using CMOS circuits and fabricated within one integrated circuit to provide numerous benefits such as high operating speed, low power consumption, and improved performance.

The foregoing description of the specific embodiments is provided to enable any person skilled in the art to make or use the invention. Various modifications to these embodiments will be readily apparent to those skilled in the art, and the generic principles defined herein may be applied to other embodiments without the use of the inventive faculty. For example, charge pump 1032 in FIG. 10 can be replaced with a gm amplifier. Thus, the specific implementation details described herein are intended to be illustrative, and not limitations, of the present invention. Accordingly, the invention is not intended to be limited to the embodiments shown herein but is to be accorded the widest scope consistent with the principles and novel features disclosed herein, and as defined by the following claims.

What is claimed is:

1. A control loop comprising:
   a detector configured to receive an input signal and a reference signal and to provide a detector output signal indicative of a difference between the input signal and the reference signal;
   a lowpass filter coupled to the detector and configured to receive the detector output signal and to provide a filtered signal;
   a transconductance (gm) amplifier coupled to the lowpass filter and configured to receive the filtered signal and to provide a current output signal, wherein use of the filtered signal facilitates design requirements of the gm amplifier thereby improving operations thereof;
   a loop filter coupled to the gm amplifier and configured to receive the current output signal and to provide a control signal; and
   an oscillator coupled to the loop filter and configured to receive the control signal and to provide an oscillator signal having a property that is adjusted by the control signal, and
   wherein the reference signal is adjusted by the oscillator signal.

2. The control loop of claim 1, wherein the lowpass filter is implemented as a single-pole RC filter.

3. The control loop of claim 1, further comprising:
   a divider coupled to the oscillator and configured to receive and divide the oscillator signal to generate the reference signal.

4. The control loop of claim 1, wherein the input signal is a serial data stream.

5. The control loop of claim 4, wherein the serial data stream has a data rate of at least 2.488 GHz.

6. The control loop of claim 1, wherein the detector is configured to provide a first signal and a second signal, and wherein the first signal is indicative of a phase advance of the input signal relative to the reference signal and the second signal is indicative of a phase advance of the reference signal relative to the input signal.

7. The control loop of claim 1, wherein the detector is a phase detector.

8. The control loop of claim 1, wherein the detector is a frequency detector.

9. The control loop of claim 1, wherein the detector and gm amplifier are implemented using CMOS technology.

10. The control loop of claim 1, wherein the detector and gm amplifier are implemented using differential circuits.

11. The control loop of claim 1, wherein the gm amplifier includes:
    a differential amplifier configured to receive the filtered signal; and
    a current load circuit coupled to the differential amplifier and configured to provide the current output signal.

12. The control loop of claim 11, wherein the gm amplifier further includes:
    a common mode feedback circuit operative to receive the current output signal and to provide a signal that adjusts an average current of the current load circuit.

13. The control loop of claim 1, wherein the detector output signal has a peak-to-peak signal swing of less than one volt.

14. The control loop of claim 1, wherein the detector, gm amplifier, and at least a portion of the loop filter and oscillator are implemented within one CMOS integrated circuit.

15. A transceiver circuit comprising the control loop of claim 1.

16. A communication system comprising the control loop of claim 1.

17. The control loop of claim 1, wherein the lowpass filter is implemented using differential circuits.

18. The control loop of claim 17, wherein the detector output signal includes a pair of up signals and a pair of down signals, the pair of up signals further including a up positive signal and a up negative signal that are opposite of each other, and the pair of down signals further including a down positive signal and a down negative signal that are opposite of each other;
    wherein the lowpass filter is configured to receive the pairs of up and down signals and provide the filtered signal having a positive component and a negative component; and
    wherein the up positive signal is coupled to the down negative signal to provide the positive component and the up negative signal is coupled to the down positive signal to provide the negative component.

19. A phase locked loop comprising:
    a phase detector configured to receive an input signal and a reference signal and to provide a detector output signal indicative of timing differences between the input signal and the reference signal;
    a lowpass filter coupled to the phase detector and configured to receive the detector output signal and to provide a filtered signal;
    a gm amplifier coupled to the lowpass filter and configured to receive the filtered signal and to provide a current output signal, wherein use of the filtered signal facilitates design requirements of the gm amplifier thereby improving operations thereof;
    a loop filter coupled to the gm amplifier and configured to receive the current output signal and to provide a control signal; and
    an oscillator coupled to the loop filter and configured to receive the control signal and to provide a clock signal having a frequency that is adjusted by the control signal, and
    wherein the reference signal is derived from the clock signal, and wherein the input signal is a serial data stream.

20. The phase locked loop of claim 19, wherein the phase detector and gm amplifier are implemented using CMOS technology.

21. A method for generating a clock signal locked to an input signal, the method comprising:
    receiving the input signal and a reference signal derived from the clock signal;
    generating a detector output signal indicative of timing differences between the input signal and the reference signal;
    filtering the detector output signal with a lowpass filter to remove high frequency components;

converting the filtered detector output signal to a current signal with a transconductance (gm) amplifier, wherein use of the filtered detector output signal facilitates design requirements of the gm amplifier thereby improving operations thereof;

filtering the current signal with a loop filter to generate a control signal; and adjusting the frequency of an oscillator with the control signal such that the clock signal is locked to the input signal.

22. The method of claim 21, wherein the input signal is a serial data stream.

23. The method of claim 21, wherein the detector output signal has a peak-to-peak signal swing of less than one volt.

24. An interface unit for use in a communication system, comprising:

a format converter operative to receive serial input data and provide parallel output data;

a locked loop coupled to the format converter and configured to receive the serial input data and to provide a clock signal to the format converter, wherein the locked loop includes a detector configured to receive the serial input data and a reference signal and to provide a detector output signal indicative of a difference between the serial input data and the reference signal, a lowpass filter coupled to the detector and configured to receive the detector output signal and to provide a filtered signal;

a transconductance (gm) amplifier coupled to the lowpass filter and configured to receive the filtered signal and to provide a current output signal, wherein use of the filtered signal facilitates design requirements of the gm amplifier thereby improving operations thereof;

a loop filter coupled to the gm amplifier and configured to receive the current output signal and to provide a control signal, and an oscillator coupled to the loop filter and configured to receive the control signal and to provide an oscillator signal having a property that is adjusted by the control signal, and wherein the reference signal is adjusted by the oscillator signal.

25. The interface unit of claim 24, wherein the serial data stream of the serial input data has a data rate of at least 2.488 GHz.

26. A multi-section locked loop for use in a high frequency application comprising:

a first loop section including a first detector configured to receive a first input signal and a first reference signal and provide a first detector output signal indicative of a difference between the first input signal and the first reference signal, a lowpass filter coupled to the first detector and configured to receive the first detector output signal and provide a filtered signal, and a transconductance (gm) amplifier coupled to the lowpass filter and configured to receive the filtered signal and provide a first loop output signal;

a second loop section configured to receive a second input signal and a second reference signal and provide a second loop output signal indicative of a difference between the second input signal and the second reference signal;

a loop filter operatively coupled to the first and second loop sections and configured to receive the first or second loop output signal and provide a control signal; and an oscillator coupled to the loop filter and configured to receive the control signal and provide an oscillator signal having a property that is adjusted by the control signal, wherein the first and second reference signals are adjusted by the oscillator signal.

27. The multi-section locked loop of claim 26, wherein the second loop section includes a second detector configured to receive the second input signal and the second reference signal and provide a second detector output signal indicative of a difference between the second input signal and the second reference signal, and a charge pump coupled to the second detector and configured to receive the second detector output signal and provide the second loop output signal.

28. The multi-section locked loop of claim 26, further comprising:

a divider coupled to the oscillator and configured to receive the oscillator signal and provide the second reference signal;

wherein the first input signal is a data stream and the second input signal is a reference clock; and wherein the oscillator signal is used by the divider to provide the second reference signal.

29. A control loop comprising:

a detector configured to receive an input signal and a reference signal and to provide a detector output signal indicative of a difference between the input signal and the reference signal, the detector output signal comprising one or more digital signals;

a lowpass filter coupled to the detector and configured to receive the detector output signal and to provide a filtered analog voltage signal;

a transconductance (gm) amplifier connected to the lowpass filter and configured to receive the filtered analog voltage signal and to provide a current output signal, wherein use of the filtered analog voltage signal facilitates design requirements of the gm amplifier thereby improving operations thereof;

a loop filter connected to the gm amplifier and configured to receive the current output signal and to provide a voltage control signal; and an oscillator coupled to the loop filter and configured to receive the voltage control signal and to provide an oscillator signal having a property that is adjusted by the voltage control signal, and wherein the reference signal is adjusted by the oscillator signal.

* * * * *